(12) United States Patent
Sako et al.

(10) Patent No.: US 7,304,932 B2
(45) Date of Patent: Dec. 4, 2007

(54) DATA RECORDING MEDIUM, AND DATA RECORDING METHOD AND DEVICE

(75) Inventors: Yoichiro Sako, Tokyo (JP); Tatsuya Inokuchi, Tokyo (JP); Takashi Kihara, Chiba (JP); Shunsuke Furukawa, Tokyo (JP); Yoriaki Kanada, Kanagawa (JP); Akiya Saito, Kanagawa (JP); Toru Aida, Kanagawa (JP); Tatsushi Sano, Kanagawa (JP); Yoshiro Miyoshi, Kanagawa (JP); Yoshinobu Usui, Kanagawa (JP); Toshihiko Senno, Kanagawa (JP)

(73) Assignees: Sony Corporation, Tokyo (JP); Sony Disc & Digital Solutions Inc., Tokyo (JP)

( * ) Notice: Subject to any disclaimer, the term of this patent is extended or adjusted under 35 U.S.C. 154(b) by 631 days.

(21) Appl. No.: 10/483,261

(22) PCT Filed: May 12, 2003

(86) PCT No.: PCT/JP03/05875

§ 371 (c)(1),
(2), (4) Date: Jan. 14, 2004

(87) PCT Pub. No.: WO03/096343

PCT Pub. Date: Nov. 20, 2003

(65) Prior Publication Data

US 2004/0202082 A1    Oct. 14, 2004

(30) Foreign Application Priority Data

May 14, 2002   (JP)   ............................. 2002-138200

(51) Int. Cl.
*G11B 5/09*    (2006.01)

(52) U.S. Cl. ..................... 369/59.24; 341/52; 341/58; 341/59

(58) Field of Classification Search ..................... None
See application file for complete search history.

(56) References Cited

U.S. PATENT DOCUMENTS

| | | | | |
|---|---|---|---|---|
| 5,400,023 A | * | 3/1995 | Ino et al. ...................... 341/59 |
| 5,774,078 A | * | 6/1998 | Tanaka et al. ................. 341/68 |
| 6,281,815 B1 | * | 8/2001 | Shim et al. .................... 341/59 |
| 6,492,920 B2 | * | 12/2002 | Oki et al. ................. 369/59.24 |
| 6,496,541 B1 | * | 12/2002 | Kahlman et al. ............. 360/41 |
| 6,573,848 B2 | * | 6/2003 | Hayami ....................... 341/68 |
| 6,690,308 B2 | * | 2/2004 | Hayami ....................... 341/68 |
| 6,853,320 B2 | * | 2/2005 | Hayami et al. ............. 341/143 |
| 6,861,965 B2 | * | 3/2005 | Kayanuma et al. ........... 341/59 |
| 6,963,296 B2 | * | 11/2005 | Oki et al. ................... 341/106 |

FOREIGN PATENT DOCUMENTS

| | | |
|---|---|---|
| JP | 9-288864 | 11/1997 |
| JP | 2002-216435 | 8/2002 |

* cited by examiner

*Primary Examiner*—Thang V. Tran
(74) *Attorney, Agent, or Firm*—Oblon, Spivak, McClelland, Maier & Neustadt, P.C.

(57) ABSTRACT

A recording method for converting m-bit data into n-bit (where n>m) bit data whose run length is restricted and recoding the converted data on a recording medium, the recording method comprising the steps of when at least preceded data is data containing a special data pattern, lightening the restriction of the run length; and recording data so that the cumulative value of DC components per unit time increase when the data is reproduced in the state that the run length is restricted.

42 Claims, 17 Drawing Sheets

Fig. 8

| HEXADECIMAL | DECIMAL | DATA SYMBOL d1........d8 | CODE SYMBOL C1................C14 |
|---|---|---|---|
| 00h | 000 | 00000000 | 01001000100000 |
| 01h | 001 | 00000001 | 10000100000000 |
| 02h | 002 | 00000010 | 10010000100000 |
| 03h | 003 | 00000011 | 10001000100000 |
| 04h | 004 | 00000100 | 01000100000000 |
| 05h | 005 | 00000101 | 00000100010000 |
| 06h | 006 | 00000110 | 00010000100000 |
| 07h | 007 | 00000111 | 00100100000000 |
| 08h | 008 | 00001000 | 01001001000000 |
| 09h | 009 | 00001001 | 10000001000000 |
| 0Ah | 010 | 00001010 | 10010001000000 |
| 0Bh | 011 | 00001011 | 10001001000000 |
| 0Ch | 012 | 00001100 | 01000001000000 |
| 0Dh | 013 | 00001101 | 00000001000000 |
| 0Eh | 014 | 00001110 | 00010001000000 |
| 0Fh | 015 | 00001111 | 00100001000000 |
| 10h | 016 | 00010000 | 10000000100000 |
| 11h | 017 | 00010001 | 10000010000000 |
| 12h | 018 | 00010010 | 10010010000000 |
| 13h | 019 | 00010011 | 00100000100000 |
| 14h | 020 | 00010100 | 01000010000000 |
| 15h | 021 | 00010101 | 00000010000000 |
| 16h | 022 | 00010110 | 00010010000000 |
| 17h | 023 | 00010111 | 00100010000000 |
| 18h | 024 | 00011000 | 01001000010000 |
| 19h | 025 | 00011001 | 10000000010000 |
| 1Ah | 026 | 00011010 | 10010000010000 |
| 1Bh | 027 | 00011011 | 10001000010000 |
| 1Ch | 028 | 00011100 | 01000000010000 |
| 1Dh | 029 | 00011101 | 00001000010000 |
| 1Eh | 030 | 00011110 | 00010000010000 |
| 1Fh | 031 | 00011111 | 00100000010000 |
| 20h | 032 | 00100000 | 00000000100000 |
| 21h | 033 | 00100001 | 10000100001000 |
| 22h | 034 | 00100010 | 00001000100000 |
| 23h | 035 | 00100011 | 00100100100000 |
| 24h | 036 | 00100100 | 01000100001000 |
| 25h | 037 | 00100101 | 00000100001000 |
| 26h | 038 | 00100110 | 01000000100000 |
| 27h | 039 | 00100111 | 00100100001000 |
| 28h | 040 | 00101000 | 01001001001000 |
| 29h | 041 | 00101001 | 10000001001000 |
| 2Ah | 042 | 00101010 | 10010001001000 |
| 2Bh | 043 | 00101011 | 10001001001000 |
| 2Ch | 044 | 00101100 | 01000001001000 |
| 2Dh | 045 | 00101101 | 00000001001000 |
| 2Eh | 046 | 00101110 | 00010001001000 |
| 2Fh | 047 | 00101111 | 00100001001000 |

Fig. 9

| | | | |
|---|---|---|---|
| 30h | 048 | 00110000 | 00000100000000 |
| 31h | 049 | 00110001 | 10000010001000 |
| 32h | 050 | 00110010 | 10010010001000 |
| 33h | 051 | 00110011 | 10000100010000 |
| 34h | 052 | 00110100 | 01000010001000 |
| 35h | 053 | 00110101 | 00000010001000 |
| 36h | 054 | 00110110 | 00010010001000 |
| 37h | 055 | 00110111 | 00100010001000 |
| 38h | 056 | 00111000 | 01001000001000 |
| 39h | 057 | 00111001 | 10000000001000 |
| 3Ah | 058 | 00111010 | 10010000001000 |
| 3Bh | 059 | 00111011 | 10001000001000 |
| 3Ch | 060 | 00111100 | 01000000001000 |
| 3Dh | 061 | 00111101 | 00001000001000 |
| 3Eh | 062 | 00111110 | 00010000001000 |
| 3Fh | 063 | 00111111 | 00100000001000 |
| 40h | 064 | 01000000 | 01001000100100 |
| 41h | 065 | 01000001 | 10000100100100 |
| 42h | 066 | 01000010 | 10010000100100 |
| 43h | 067 | 01000011 | 10001000100100 |
| 44h | 068 | 01000100 | 01000100100100 |
| 45h | 069 | 01000101 | 00000000100100 |
| 46h | 070 | 01000110 | 00010000100100 |
| 47h | 071 | 01000111 | 00100100100100 |
| 48h | 072 | 01001000 | 01001001000100 |
| 49h | 073 | 01001001 | 10000001000100 |
| 4Ah | 074 | 01001010 | 10010001000100 |
| 4Bh | 075 | 01001011 | 10001001000100 |
| 4Ch | 076 | 01001100 | 01000001000100 |
| 4Dh | 077 | 01001101 | 00000001000100 |
| 4Eh | 078 | 01001110 | 00010001000100 |
| 4Fh | 079 | 01001111 | 00100001000100 |
| 50h | 080 | 01010000 | 10000000100100 |
| 51h | 081 | 01010001 | 10000010000100 |
| 52h | 082 | 01010010 | 10010010000100 |
| 53h | 083 | 01010011 | 00100000100100 |
| 54h | 084 | 01010100 | 01000010000100 |
| 55h | 085 | 01010101 | 00000010000100 |
| 56h | 086 | 01010110 | 00010010000100 |
| 57h | 087 | 01010111 | 00100010000100 |
| 58h | 088 | 01011000 | 01001000000100 |
| 59h | 089 | 01011001 | 10000000000100 |
| 5Ah | 090 | 01011010 | 10010000000100 |
| 5Bh | 091 | 01011011 | 10001000000100 |
| 5Ch | 092 | 01011100 | 01000000000100 |
| 5Dh | 093 | 01011101 | 00001000000100 |
| 5Eh | 094 | 01011110 | 00010000000100 |
| 5Fh | 095 | 01011111 | 00100000000100 |
| 60h | 096 | 01100000 | 01001000100010 |
| 61h | 097 | 01100001 | 10000100100010 |

Fig. 10

| | | | |
|---|---|---|---|
| 62h | 098 | 01100010 | 10010000100010 |
| 63h | 099 | 01100011 | 10001000100010 |
| 64h | 100 | 01100100 | 01000100100010 |
| 65h | 101 | 01100101 | 00000000100010 |
| 66h | 102 | 01100110 | 01000000100100 |
| 67h | 103 | 01100111 | 00100100100010 |
| 68h | 104 | 01101000 | 01001001000010 |
| 69h | 105 | 01101001 | 10000001000010 |
| 6Ah | 106 | 01101010 | 10010001000010 |
| 6Bh | 107 | 01101011 | 10001001000010 |
| 6Ch | 108 | 01101100 | 01000001000010 |
| 6Dh | 109 | 01101101 | 00000001000010 |
| 6Eh | 110 | 01101110 | 00010001000010 |
| 6Fh | 111 | 01101111 | 00100001000010 |
| 70h | 112 | 01110000 | 10000001000010 |
| 71h | 113 | 01110001 | 10000010000010 |
| 72h | 114 | 01110010 | 10010010000010 |
| 73h | 115 | 01110011 | 00100000100010 |
| 74h | 116 | 01110100 | 01000010000010 |
| 75h | 117 | 01110101 | 00000010000010 |
| 76h | 118 | 01110110 | 00010010000010 |
| 77h | 119 | 01110111 | 00100010000010 |
| 78h | 120 | 01111000 | 01001000000010 |
| 79h | 121 | 01111001 | 00001001001000 |
| 7Ah | 122 | 01111010 | 10010000000010 |
| 7Bh | 123 | 01111011 | 10001000000010 |
| 7Ch | 124 | 01111100 | 01000000000010 |
| 7Dh | 125 | 01111101 | 00001000000010 |
| 7Eh | 126 | 01111110 | 00010000000010 |
| 7Fh | 127 | 01111111 | 00100000000010 |
| 80h | 128 | 10000000 | 01001000100001 |
| 81h | 129 | 10000001 | 10000100100001 |
| 82h | 130 | 10000010 | 10010000100001 |
| 83h | 131 | 10000011 | 10001000100001 |
| 84h | 132 | 10000100 | 01000100100001 |
| 85h | 133 | 10000101 | 00000000100001 |
| 86h | 134 | 10000110 | 00010000100001 |
| 87h | 135 | 10000111 | 00100100100001 |
| 88h | 136 | 10001000 | 01001001000001 |
| 89h | 137 | 10001001 | 10000001000001 |
| 8Ah | 138 | 10001010 | 10010001000001 |
| 8Bh | 139 | 10001011 | 10001001000001 |
| 8Ch | 140 | 10001100 | 01000001000001 |
| 8Dh | 141 | 10001101 | 00000001000001 |
| 8Eh | 142 | 10001110 | 00010001000001 |
| 8Fh | 143 | 10001111 | 00100001000001 |
| 90h | 144 | 10010000 | 10000000100001 |
| 91h | 145 | 10010001 | 10000010000001 |
| 92h | 146 | 10010010 | 10010010000001 |
| 93h | 147 | 10010011 | 00100000100001 |

Fig. 11

| | | | |
|---|---|---|---|
| 94h | 148 | 10010100 | 01000010000001 |
| 95h | 149 | 10010101 | 00000010000001 |
| 96h | 150 | 10010110 | 00010010000001 |
| 97h | 151 | 10010111 | 00100010000001 |
| 98h | 152 | 10011000 | 01001000000001 |
| 99h | 153 | 10011001 | 10000010010000 |
| 9Ah | 154 | 10011010 | 10010000000001 |
| 9Bh | 155 | 10011011 | 10001000000001 |
| 9Ch | 156 | 10011100 | 01000010010000 |
| 9Dh | 157 | 10011101 | 00001000000001 |
| 9Eh | 158 | 10011110 | 00010000000001 |
| 9Fh | 159 | 10011111 | 00100010010000 |
| A0h | 160 | 10100000 | 00001000100001 |
| A1h | 161 | 10100001 | 10000100001001 |
| A2h | 162 | 10100010 | 01000100010000 |
| A3h | 163 | 10100011 | 00000100100001 |
| A4h | 164 | 10100100 | 01000100001001 |
| A5h | 165 | 10100101 | 00000100001001 |
| A6h | 166 | 10100110 | 01000000100001 |
| A7h | 167 | 10100111 | 00100100001001 |
| A8h | 168 | 10101000 | 01001001001001 |
| A9h | 169 | 10101001 | 10000001001001 |
| AAh | 170 | 10101010 | 10010001001001 |
| ABh | 171 | 10101011 | 10001001001001 |
| ACh | 172 | 10101100 | 01000001001001 |
| ADh | 173 | 10101101 | 00000001001001 |
| AEh | 174 | 10101110 | 00010001001001 |
| AFh | 175 | 10101111 | 00100001001001 |
| B0h | 176 | 10110000 | 00000100100000 |
| B1h | 177 | 10110001 | 10000010001001 |
| B2h | 178 | 10110010 | 10010010001001 |
| B3h | 179 | 10110011 | 00100100010000 |
| B4h | 180 | 10110100 | 01000010001001 |
| B5h | 181 | 10110101 | 00000010001001 |
| B6h | 182 | 10110110 | 00010010001001 |
| B7h | 183 | 10110111 | 00100010001001 |
| B8h | 184 | 10111000 | 01001000001001 |
| B9h | 185 | 10111001 | 10000000001001 |
| BAh | 186 | 10111010 | 10010000001001 |
| BBh | 187 | 10111011 | 10001000001001 |
| BCh | 188 | 10111100 | 01000000001001 |
| BDh | 189 | 10111101 | 00001000001001 |
| BEh | 190 | 10111110 | 00010000001001 |
| BFh | 191 | 10111111 | 00100000001001 |
| C0h | 192 | 11000000 | 01000100100000 |
| C1h | 193 | 11000001 | 10000100010001 |
| C2h | 194 | 11000010 | 10010010010000 |
| C3h | 195 | 11000011 | 00001000100100 |
| C4h | 196 | 11000100 | 01000100010001 |
| C5h | 197 | 11000101 | 00000100010001 |

Fig. 12

| | | | |
|---|---|---|---|
| C6h | 198 | 11000110 | 00010010010000 |
| C7h | 199 | 11000111 | 00100100010001 |
| C8h | 200 | 11001000 | 00001001000001 |
| C9h | 201 | 11001001 | 10000100000001 |
| CAh | 202 | 11001010 | 00001001000100 |
| CBh | 203 | 11001011 | 00001001000000 |
| CCh | 204 | 11001100 | 01000100000001 |
| CDh | 205 | 11001101 | 00000100000001 |
| CEh | 206 | 11001110 | 00000010010000 |
| CFh | 207 | 11001111 | 00100100000001 |
| D0h | 208 | 11010000 | 00000100100100 |
| D1h | 209 | 11010001 | 10000010010001 |
| D2h | 210 | 11010010 | 10010010010001 |
| D3h | 211 | 11010011 | 10000100100000 |
| D4h | 212 | 11010100 | 01000010010001 |
| D5h | 213 | 11010101 | 00000010010001 |
| D6h | 214 | 11010110 | 00010010010001 |
| D7h | 215 | 11010111 | 00100010010001 |
| D8h | 216 | 11011000 | 01001000010001 |
| D9h | 217 | 11011001 | 10000000010001 |
| DAh | 218 | 11011010 | 10010000010001 |
| DBh | 219 | 11011011 | 10001000010001 |
| DCh | 220 | 11011100 | 01000000010001 |
| DDh | 221 | 11011101 | 00001000010001 |
| DEh | 222 | 11011110 | 00010000010001 |
| DFh | 223 | 11011111 | 00100000010001 |
| E0h | 224 | 11100000 | 01000100000010 |
| E1h | 225 | 11100001 | 00000100000010 |
| E2h | 226 | 11100010 | 10000100010010 |
| E3h | 227 | 11100011 | 00100100000010 |
| E4h | 228 | 11100100 | 01000100010010 |
| E5h | 229 | 11100101 | 00000100010010 |
| E6h | 230 | 11100110 | 01000000100010 |
| E7h | 231 | 11100111 | 00100100010010 |
| E8h | 232 | 11101000 | 10000100000010 |
| E9h | 233 | 11101001 | 10000100000100 |
| EAh | 234 | 11101010 | 00001001001001 |
| EBh | 235 | 11101011 | 00001001000010 |
| ECh | 236 | 11101100 | 01000100000100 |
| EDh | 237 | 11101101 | 00000100000100 |
| EEh | 238 | 11101110 | 00010000100010 |
| EFh | 239 | 11101111 | 00100100000100 |
| F0h | 240 | 11110000 | 00000100100010 |
| F1h | 241 | 11110001 | 10000010010010 |
| F2h | 242 | 11110010 | 10010010010010 |
| F3h | 243 | 11110011 | 00001000100010 |
| F4h | 244 | 11110100 | 01000010010010 |
| F5h | 245 | 11110101 | 00000010010010 |
| F6h | 246 | 11110110 | 00010010010010 |
| F7h | 247 | 11110111 | 00100010010010 |

*Fig. 13*

| F8h | 248 | 11111000 | 01001000010010 |
|-----|-----|----------|----------------|
| F9h | 249 | 11111001 | 10000000010010 |
| FAh | 250 | 11111010 | 10010000010010 |
| FBh | 251 | 11111011 | 10001000010010 |
| FCh | 252 | 11111100 | 01000000010010 |
| FDh | 253 | 11111101 | 00001000010010 |
| FEh | 254 | 11111110 | 00010000010010 |
| FFh | 255 | 11111111 | 00100000010010 |

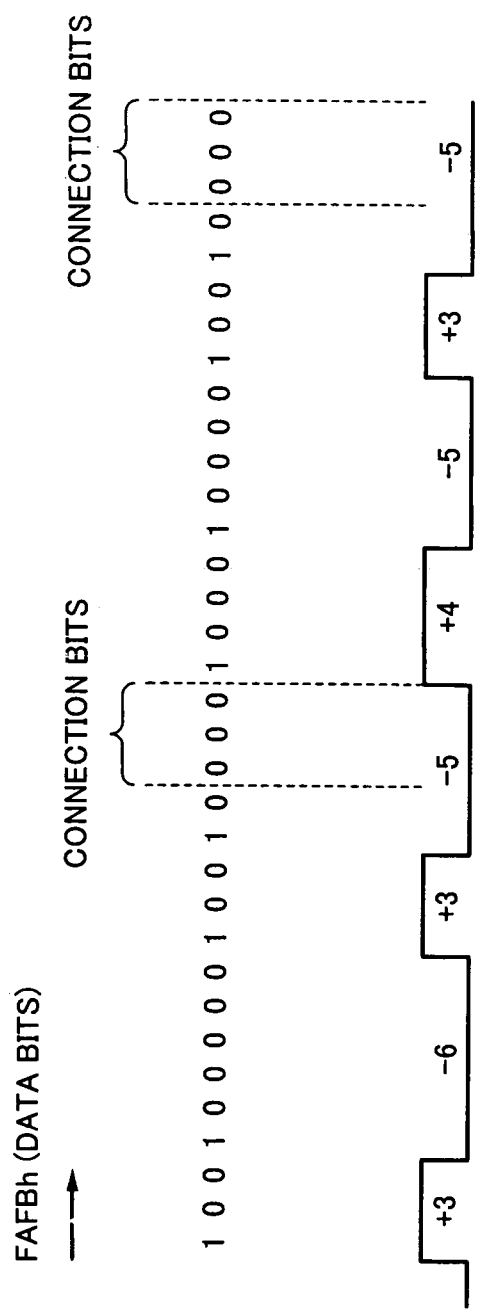

DATA RECORDING MEDIUM, AND DATA RECORDING METHOD AND DEVICE

TECHNICAL FIELD

The present invention relates to a data recording medium and a data recording method and apparatus applicable to for example a read-only memory (ROM) type optical disc.

BACKGROUND ART

Since optical discs such as a CD (Compact Disc) and a CD-ROM (Compact Disc Read Only Memory) are easy to handle and are produced at relatively low cost, they have been widely used as recording mediums for storing data. In recent years, a CD-R (Compact Disc Recordable) disc, on which data can be recorded once, and a CD-RW (Compact Disc ReWritable) disc, on which data can be rewritten, have come out. Thus, data can be easily recorded on such recordable optical discs. As a result, optical discs that accord with the CD standard such as a CD-DA disc, a CD-ROM disc, a CD-R disc, and a CD-RW disc have become the mainstream of data recording mediums. In addition, in recent years, audio data is compressed according to the MP3 (MPEG1 Audio Layer-3) and the ATRAC (Adaptive TRansform Acoustic Coding) 3 and recorded on the CD-ROM disc, the CD-R disc, the CD-RW disc, and so forth.

However, as a CD-R disc and a CD-RW (Compact Disc ReWritable) disc have come out, data recoded on a CD disc can be easily copied to those discs. As a result, a problem about copyright protection has arisen. Thus, when content data is recorded to a recordable optical disc, it is necessary to take measures to protect content data.

FIG. 1 shows an outline of a flow of a copying process. A reproducing apparatus denoted by reference numeral 41 reproduces data from an original disc, for example a CD 42. Reference numeral 43 represents an optical pickup. Reference numeral 44 represents a reproduction signal processing portion. Reproduced data is supplied from the reproducing apparatus 41 to a recording process portion 52 of a recording apparatus 51. An optical pickup 53 records the reproduced data to an optical disc, for example a CD-R disc 54. The recorded contents for example recorded data of the original CD 42 are copied to the CD-R disc 54. Using the reproducing apparatus 41 and the recording apparatus 51, a copied disc of the original CD 42 can be easily produced.

In the case of a CD, as shown in FIG. 2, a sync detecting portion 46 of the reproducing process portion 44 detects a frame sync from a reproduced signal supplied from an input terminal 45. An EFM demodulator 46 EFM (eight to fourteen modulation) demodulates the reproduced signal and supplies the EFM-demodulated reproduced data to a CIRC (Cross Interleave Reed-Solomon Code) decoder 48. The CIRC decoder 48 corrects an error of the reproduced signal. In the EFM, each symbol (eight data bits) is converted into 14 channel bits and connection bits of three bits are added between adjacent strings of 14 channel bits. A sub code decoder 49 decodes the reproduced data and obtains a reproduced sub code.

FIG. 3 shows an outlined structure of the recoding process portion 52. Data to be recorded is supplied from an input terminal 55 to an CIRC encoder 56. The CIRC encoder 56 performs a CIRC encoding process for the data supplied from the input terminal 55. In addition, a sub code is supplied from an input terminal 57 to a sub code encoder 58. The sub code encoder 58 formats the sub code. An output of the CIRC encoder 56 and an output of the sub code encoder 58 are supplied to a multiplexer 60. In addition, a frame sync is supplied from an input terminal 59 to the multiplexer 60. The multiplexer 60 arranges those data in a predetermined order. An output of the multiplexer 60 is supplied to an EFM modulator 61. The EFM modulator 61 performs an EFM modulating process for data that is output from the multiplexer 60.

As one method for protecting content data recorded on a CD disc, it is determined whether the disc is an original CD or a CD copied from an original CD. When the disc is an original CD, a copying operation thereof can be permitted. When the disc is a copied disc, a further copying operation thereof can be prohibited.

To determine whether the disc is an original disc or a copied disc, a method for placing a defect on a disc in a master disc production stage, detecting the defect from a disc during a reproduction, and determining that the disc is an original disc based on the detected defect. In this method, however, an original disc may contain such a defect. In addition, depending on the type of a defect, it may be copied as it is. Thus, content data of an original disc cannot be prevented from being copied to a CD-R disc.

An object of the present invention is to provide a data recording medium and data recording method and apparatus that can determine whether a disc is an original disc or a copied disc and prevent a copying operation depending on the determined result without need to intentionally place a defect on the disc.

DISCLOSURE OF THE INVENTION

To solve the foregoing problem, an embodiment of the present invention is a recording method for converting m-bit data into an n-bit (where n>m) data symbol whose run length is restricted and adding a plurality of connection bits after the n-bit data symbol so that the cumulative value of DC components per unit time becomes small, the recording method comprising the steps of: when at least preceded data symbol is a special data symbol, lightening the restriction of the run length and selecting the connection bits; adding the selected connection bits to the preceded data symbol so as to generate record data; and recording the generated record data on the recording medium.

Another embodiment of the present invention is a recording method for converting m-bit data into an n-bit (where n>m) data symbol whose run length is restricted and recoding the converted data on a recording medium, the recording method comprising the steps of: when at least preceded data is data containing a special data pattern, lightening the restriction of the run length; and recording data so that the cumulative value of DC components per unit time increase when the data is reproduced in the state that the run length is restricted.

Another embodiment of the present invention is a recording apparatus, comprising: an encode process portion for performing an encode process for input data; a converting portion for converting m-bit data that is output from the encode processing portion into n-bit (where n>m) bit data whose run length is restricted so that when preceded n-bit data is data containing a special data pattern, the restriction of the run length is lightened and the cumulative value of DC components per unit time increase when the data is reproduced in the state that the run length is restricted; and a recording portion for recording data that is output from the converting portion on a recording medium.

Another embodiment of the present invention is a recording medium on which data of which m-bit data is converted into n-bit (where n>m) bit data whose run length is restricted is recorded, when at least preceded data is data containing a special data pattern, the restriction of the run length being lightened, data being recorded so that the cumulative value of DC components per unit time increase when the data is reproduced in the state that the run length is restricted.

BRIEF DESCRIPTION OF DRAWINGS

FIG. 8 is a schematic diagram showing an EFM conversion table.

FIG. 9 is a schematic diagram showing an EFM conversion table.

FIG. 10 is a schematic diagram showing an EFM conversion table.

FIG. 11 is a schematic diagram showing an EFM conversion table.

FIG. 12 is a schematic diagram showing an EFM conversion table.

FIG. 13 is a schematic diagram showing an EFM conversion table.

FIG. 17A and FIG. 17B are schematic diagrams showing DSV and a part of a waveform in the case that special data "FAFBh" has been FEM modulated.

BEST MODE FOR CARRYING OUT THE INVENTION

Next, an embodiment of the present invention will be described. The present invention provides a recording medium such as a compact disc on which a predetermined data pattern has been recorded. The predetermined data pattern composes low level data as an audio signal. When the predetermined data pattern is encoded by a conventional encoder, the cumulated value of DSV deviates from a predetermined value. When the data pattern portion is encoded by a special encoder, the cumulated value of DSV resides in the predetermined range.

After the predetermined data pattern is added to an audio signal, they are EFM modulated by the special encoder in such a manner that the cumulated value of DSV resides in the predetermined range. The modulated signal is recorded as a record signal on a disc to be produced. In the case of a digital audio signal that has been modulated by the linear PCM (Pulse Code Modulation), 16-bit data is represented by a 2's complement for each byte and recorded. Thus, the high order nibble of the high order byte of the 16-bit data is "0h" or "Fh" (where h represents hexadecimal notation). In addition, the audio signal is low level data.

According to the present invention, a record signal is selected from low level data as an audio signal whose high order nibble is "0h" or "Fh". As a result, when data is reproduced from a CD that has been produced with the record signal by a conventional CD reproducing apparatus, the record signal is prevented from being reproduced as large volume noise.

Figure 1:
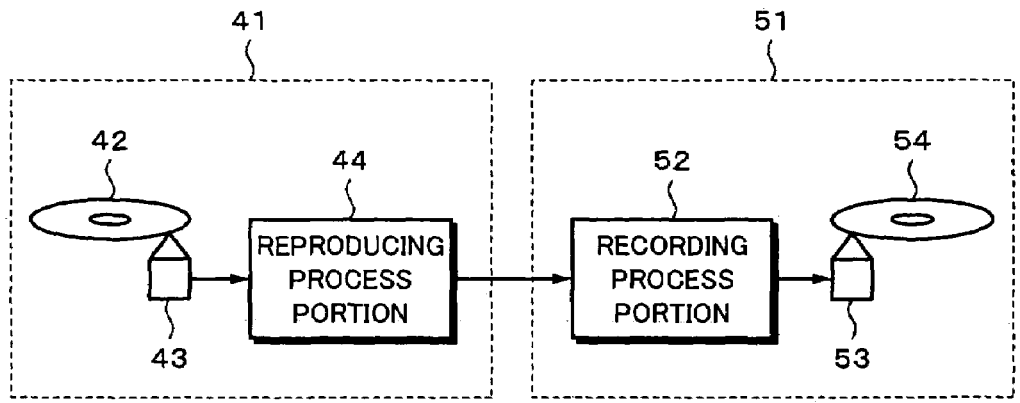
FIG. 1 is a block diagram describing a flow of a copying process of a disc.
Figure 2:
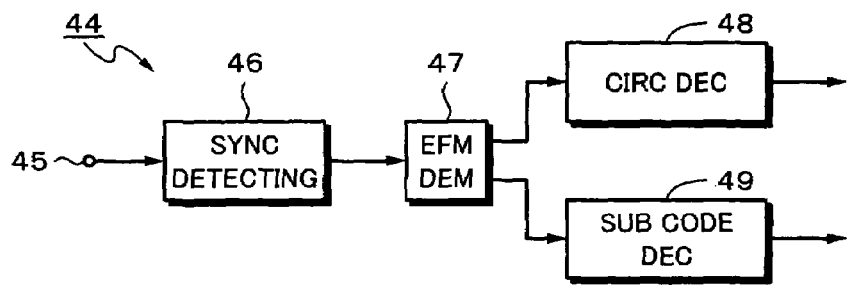
FIG. 2 is a block diagram showing an outline of a conventional reproducing process portion.
Figure 3:
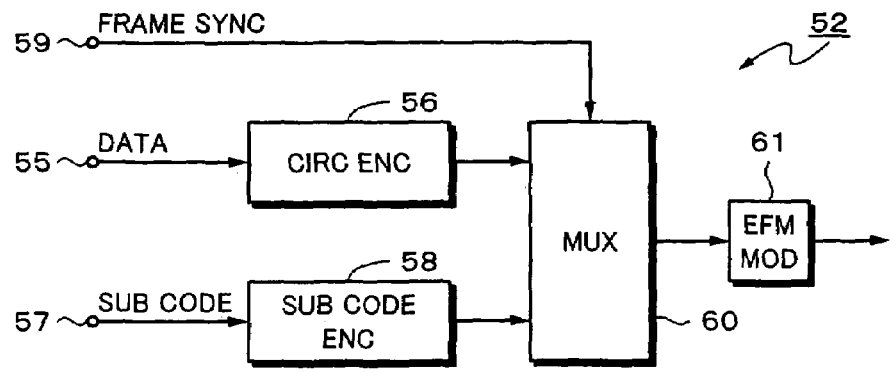
FIG. 3 is a block diagram showing an outline of a conventional recording process portion.
Figure 4:
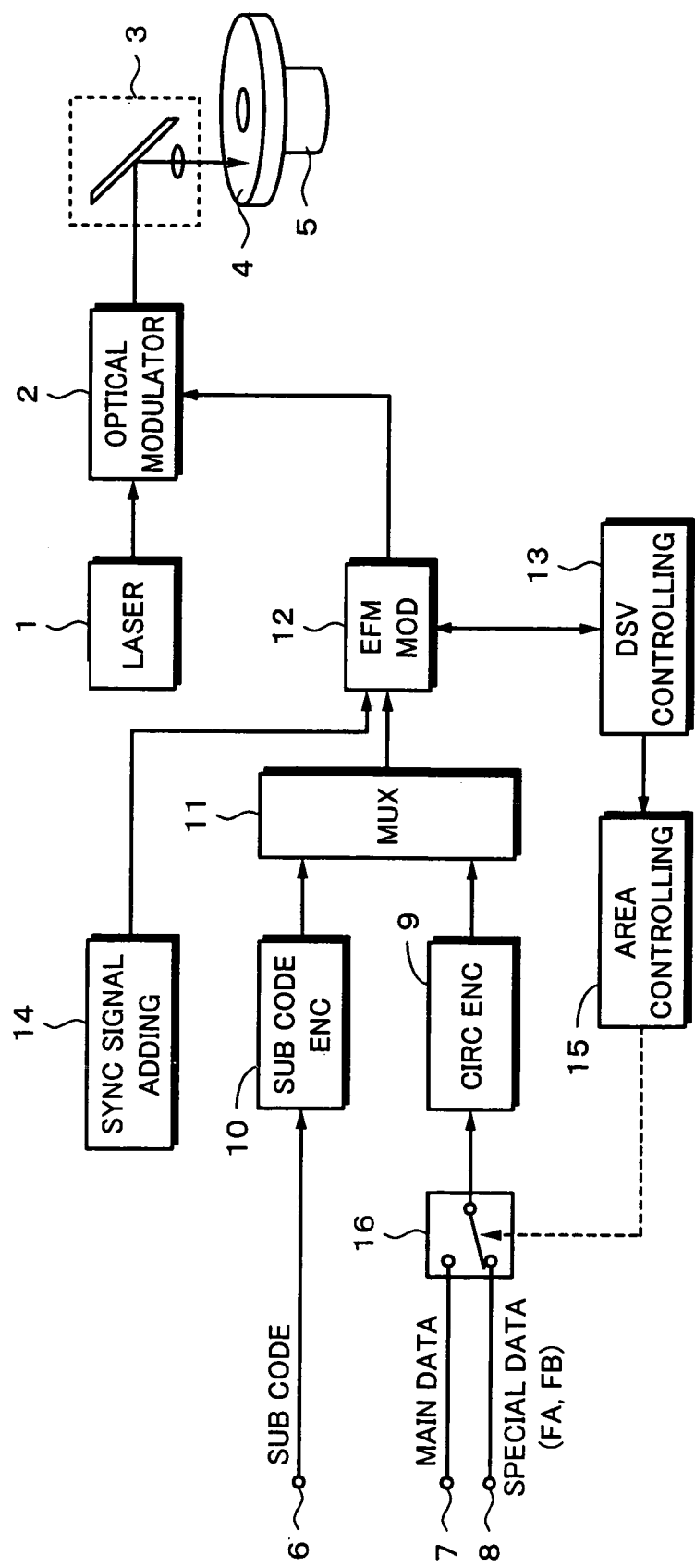
FIG. 4 is a block diagram showing an example of the structure of a mastering apparatus that produces a data recording medium according to the present invention.

FIG. 4 shows an example of the structure of a mastering apparatus that produces a data recording medium according to the present invention. The mastering apparatus has a laser light source 1 that is a gas laser (for example, an Ar ion laser, an He—Cd laser, or a Kr ion laser) or a semiconductor laser, an acoustooptic effect type or electrooptic type optical modulator 2 that modulates laser light emitted from the laser light source 1, and an optical pickup 3 that has an objective lens that collects laser light that has passed through the optical modulator 2 and radiates the collected light to a photoresist surface of a disc shaped glass master disc 4 on which photoresist as a photosensitive material has been coated.

The optical modulator 2 modulates the laser light emitted from the laser light source 1 corresponding to a record signal. The mastering apparatus radiates the modulated laser light to the glass master disc 4. As a result, a master on which data has been recorded is produced. In addition, the mastering apparatus has a servo portion (not shown). The servo portion performs a focus control for keeping the distance between the optical pickup 3 and the glass master disc 4 constant, a tracking control, and a rotation driving control of a spindle motor 5. The rotations of the glass master disc 4 are driven by the spindle motor 5.

The record signal is supplied from an EFM modulator 12 to the optical modulator 2. Main digital data to be recorded is supplied from an input terminal 7. The main digital data is for example two-channel stereo digital audio data. Special data, namely data having the foregoing predetermined data pattern, is supplied from an input terminal 8. In addition, sub code data of channels P to W according to the current CD standard is supplied from an input terminal 6.

The main digital data and the special data are switched at a predetermined timing by a switching circuit 16 under the control of an area controlling portion 15 (that will be described later) and supplied to a CIRC (Cross Interleave Reed-Solomon Code) encoder 9. The CIRC encoder 9 performs an error correction code encoding process for adding error correction parity data or the like and a scrambling process for the supplied data. In other words, one sample or one word of 16 bits is divided into two symbols of high order eight bits and low order eight bits. The error correction code encoding process for adding CIRC error correction parity data or the like and the scrambling process are performed for each symbol. A sub code encoder 10 converts the sub code that has been input from the input terminal 7 into sub code data having an EFM frame format.

An output of the CIRC encoder 9 and output data of the sub code encoder 10 are supplied to a multiplexer 11. The multiplexer 11 arranges those data in a predetermined order. Output data of the multiplexer 11 is supplied to the EFM modulator 12. The EFM modulator 12 converts an eight-bit symbol into a 14-channel bit data symbol according to a conversion table. In addition, the frame sync signal supplied from a sync signal adding circuit 14 is added to the converted data at a predetermined timing. The resultant data is output from the EFM modulator 12.

The EFM modulator 12 detects DSV of the data symbol that has been converted into 14-channel bits and supplies the detected DSV to a DSV controlling circuit 13. The DSV controlling circuit 13 selects three selection bits that connect data symbols corresponding to the supplied detected result of DSV. The EFM modulator 12 adds three connection bits to a data symbol corresponding to the selected result.

DSV is a cumulative value of which the period of a channel clock on the high level side of the EFM modulated data is counted as "+1" and the period of a channel clock on the low level side of the EFM modulated data is counted as "−1". In the following description, when the cumulative value of DSV is increased as an absolute value, it is said that DSV increases; when DSV approaches 0, it is said that DSV decreases.

There are four types of connection bits "000", "001", "010", and "100". The connection bits are selected in such a manner that after the connection bits are placed, a pattern that is smaller than 3T or larger than 11T does not take place according to the compact disc's standard and DSV converges.

An area controlling circuit 15 controls the switching of the switching circuit 16 so that a signal of which the special data supplied from the input terminal 8 has been EFM modulated is recorded in a predetermined area of the disc. At that point, the area controlling circuit 15 and the DSV controlling circuit 13 cooperate. The DSV controlling circuit 13 controls the selection of connection bits so that the special data supplied under the switching control of the switching circuit 16 of the area controlling circuit 15 lightens the selection condition of connection bits for the signal that has been EFM modulated.

The EFM modulating 12 generates a record signal in the CD EFM frame format. The record signal is supplied to the optical modulator 2. With a modulated laser beam that is output from the optical modulator 2, the photoresist on the glass master disc 4 is exposed. A developing process and an electroplating process are performed for the glass master disc 4 on which data has been recorded in such a manner. As a result, a metal master is produced. With the metal master, a mother disc is produced. With the mother disc, a stamper is produced. With the stamper, a substrate for an optical disc is produced by the compression molding method, the injection molding method, or the like. A metal reflection layer is formed on one surface of the produced disc substrate. On the reflection layer, a protection film is formed. As a result, an optical disc is produced.

Figure 5:
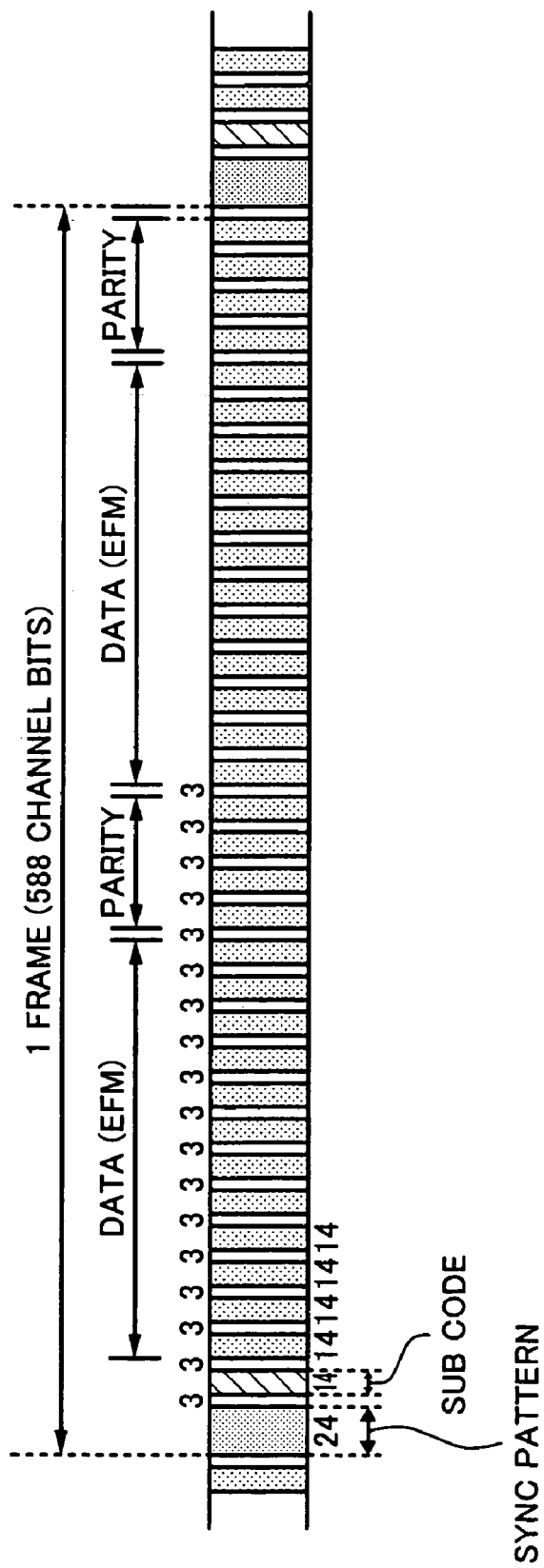
FIG. 5 is a schematic diagram showing the data structure of one EFM frame of a CD.

FIG. 5 shows the data structure of one EFM frame of a CD. In a CD, parity Q and parity P which are four symbols each are made from a total of 12 samples (24 symbols) of two-channel digital audio data. 33 symbols (264 data bits) of which one symbol of a sub code is added to a total of 32 symbols is treated as one block. In other words, one frame which has been EFM modulated contains a sub code of one symbol, data of 24 symbols, a Q parity of four symbols, and a P parity of four symbols.

In the EFM (eight to fourteen modulation) modulating system, each symbol (eight data bits) is converted into 14 channel bits. The minimum time length of the EFM modulation (namely, the time length of which the number of 0s between two 1s of a record signal becomes the minimum) Tmin is 3T. The bit length equivalent to 3T is 0.87 μm. The bit length equivalent to T is the shortest bit length. Connection bits of three bits are placed between two strings of 14 channel bits. In addition, a frame sync pattern is added at the beginning of a frame. When the period of a channel bit is T, a frame sync pattern is a pattern of which 11T, 11T, and 2T are successive. Since a pattern does not take place according to the EFM conversion rule, a frame sync can be detected with such a special pattern. The total number of bits of one EFM frame is 588 channel bits. The frame frequency is 7.35 kHz.

A group of 98 EFM frames is referred to as sub code frame (or sub code frame). A sub code frame of which 98 frames are successively re-arranged in the vertical direction is composed of a frame synchronous portion that identifies the beginning of the sub code frame, a sub code portion, data, and a parity portion. A sub code frame is equivalent to 1/75 second of a reproduction time of a conventional CD.

Figure 6:
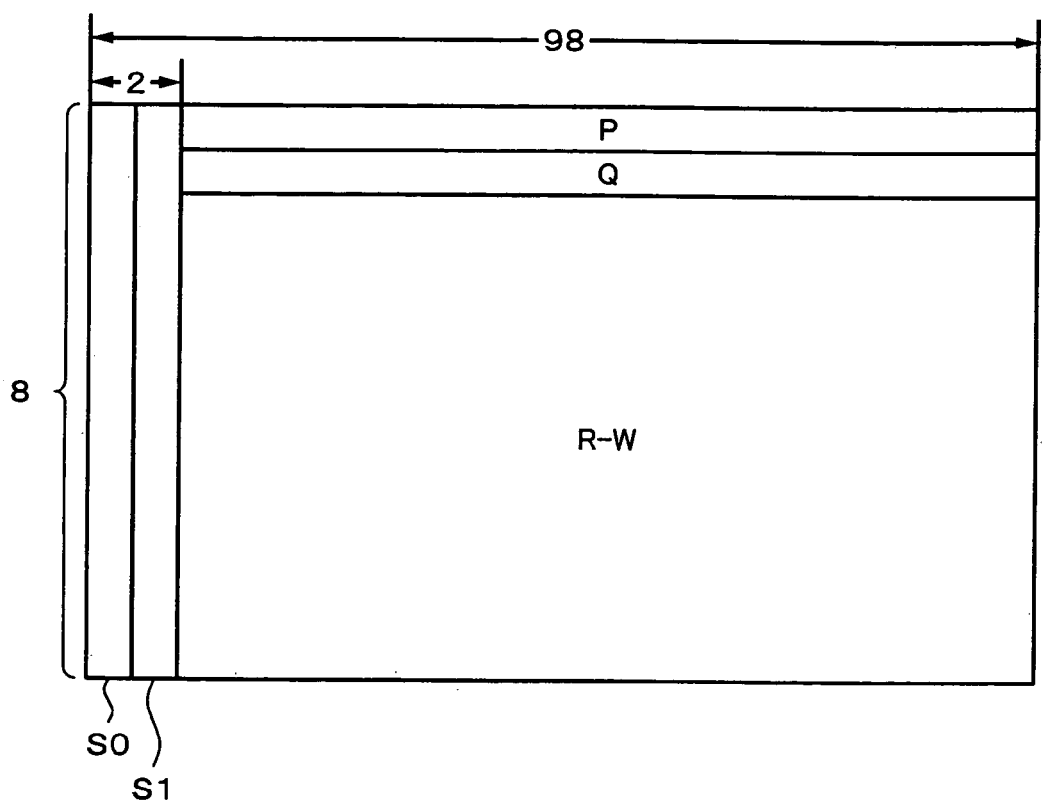
FIG. 6 is a schematic diagram showing the data structure of a sub code portion.

FIG. 6 shows the data structure of a sub code. The sub code portion is composed of 98 EFM frames. Two frames at the beginning of the sub code portion are a synchronous pattern of a sub code frame and a pattern of an EFM out-of-rule. The individual bits of the sub code portion compose P, Q, R, S, T, U, V, and W channels.

The R channel to W channel are used for special purposes such as a still picture or a sub-title display of so-called Karaoke. The P channel and Q channel are used for a track position controlling operation for the pickup during reproduction of digital data recorded on the disc.

The P channel is used to record a signal whose level is "0" in a so-called lead-in area, which is an inner peripheral portion of the disc and a signal whose levels are "0s" and "1s" repeated at predetermined periods in a so-called lead-out area, which is an outer peripheral portion of the disc. The P channel is also used to record a signal whose level is "1" between music programs in a program area formed between the lead-in area and the lead-out area of the disc and a signal whose level is "0" in the other area. The P channel is used to detect the beginning of each music program during reproduction of digital audio data recorded on the CD.

The Q channel is provided to more acutely control digital audio data recorded on the CD during reproduction. One sub code frame of the Q channel is composed of a synchronous bit portion, a control bit portion, an address bit portion, a data bit portion, and a CRC bit portion.

Figure 7:
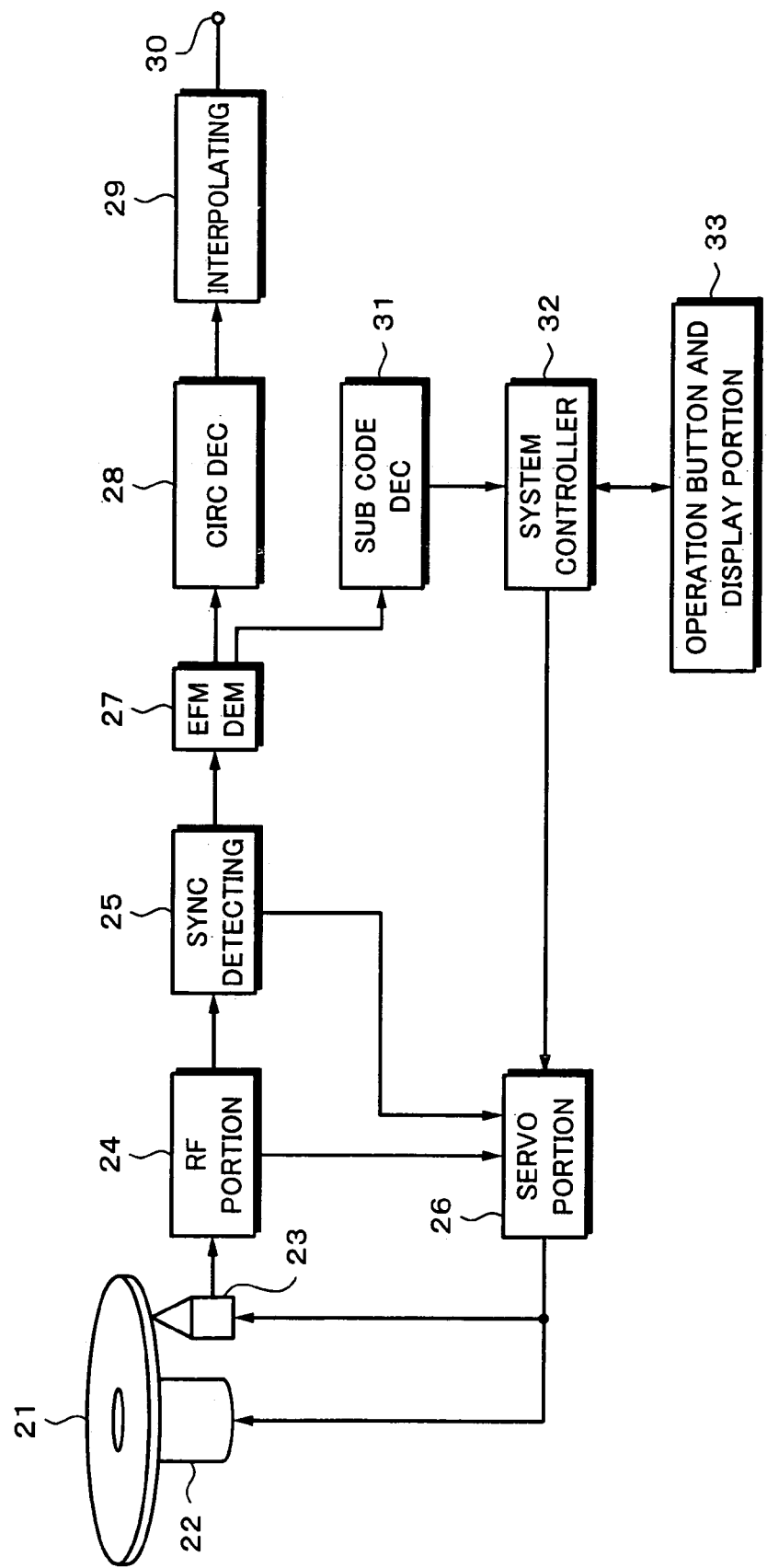
FIG. 7 is a block diagram showing an example of the structure of a reproducing apparatus that reproduces data from an optical disc.

FIG. 7 shows an example of the structure of a reproducing apparatus that reproduces data from an optical disc that has been produced in the foregoing mastering and stamping processes. Although the structure of the reproducing apparatus shown in FIG. 7 is the same as that of a conventional player or drive, the structure will be described for easy understanding of the present invention. In FIG. 7, the rotations of a disc 21 produced in the foregoing mastering and stamping processes is driven by a spindle motor 22. A signal recorded on the disc 21 is reproduced by an optical pickup 23. The optical pickup 23 is composed of a semiconductor laser as a laser light source that radiates laser light to the disc 21, an optical system such as an objective lens, a detector that receives light reflected from the disc 21, a focus and tracking mechanism, and so forth. In addition, the optical pickup 23 is traveled in the radius direction of the disc 21 by a thread mechanism (not shown).

Output signals of for example a four-divided detector of the optical pickup 23 are supplied to an RF portion 24. The RF portion 24 calculates the output signals of the individual detector elements of the four-divided detector and generates a reproduction signal (RF) signal, a focus error signal, and a tracking error signal. The reproduction signal is supplied to a sync detecting portion 25. The sync detecting portion 25 detects a frame sync from the beginning of each EFM frame. The generated frame sync, the focus error signal, and the tracking error signal are supplied to a servo portion 26. The servo portion 26 controls the rotations of the spindle motor 22 and performs a focus servo and a tracking servo of the optical pickup 23 corresponding to a reproduced clock of the RF signal.

Main data that is output from the sync detecting portion 25 is supplied to an EFM demodulator 27. The EFM demodulator 27 performs an EFM demodulating process for the main data. Main digital data is supplied from the EFM demodulator 27 to a CIRC decoder 28. The CIRC decoder 28 performs an error correcting process for the main digital data. An interpolating circuit 29 interpolates the main digital data and outputs the interpolated data as reproduced data to an output terminal 30. Sub code data is supplied from the EFM demodulator 27 to a system controller 32.

The system controller 32 is composed of a microcomputer. The system controller 32 controls operations of the whole reproducing apparatus. In association with the system controller 32, an operation button and display portion 33 is disposed. The system controller 32 controls the servo portion 26 so as to access a desired position of the digital 21.

FIG. 8 to FIG. 13 show a conversion table that represents a rule for which data bits of eight bits (sometimes referred to as data symbol) of the EFM modulator 12 are converted into channel bits of 14 bits (sometimes referred to as code symbol). In FIG. 8 to FIG. 13, data bits are represented in hexadecimal notation (00 to FF), decimal notation (0 to 255), and binary notation. "1" of a code symbol of 14 bits represents a position at which a value is inverted. Since one data symbol is composed of eight bits, there are 256 patterns thereof. All code symbols of 14 bits satisfy an EFM rule of which the minimum time length (time length in which the number of 0s between two 1s of a record signal becomes the minimum) $T_{min}$ is 3T and the maximum time length (time length in which the number of 0s between two 1s of a record signal becomes the maximal) $T_{max}$ is 11T (hereinafter sometimes referred to as run length limit condition).

When code symbols of 14 bits each are connected, connection bits are required to satisfy the foregoing run length limit conditions Tmin=3T and Tmax=11T. There are four types of patterns "000", "001", "010", and "100" as connection bits. Next, an example of which connection bits are used to connect code symbols of 14 bits each will be described with reference to FIG. 14A to FIG. 14D. The following example is described in "Book on Compact Disc (Version 3) [translated title; written in Japanese]", published by Ohm Sha Publishing Company, Japan, Mar. 25, 2001.

Figures 14A, 14B, 14C, 14D:
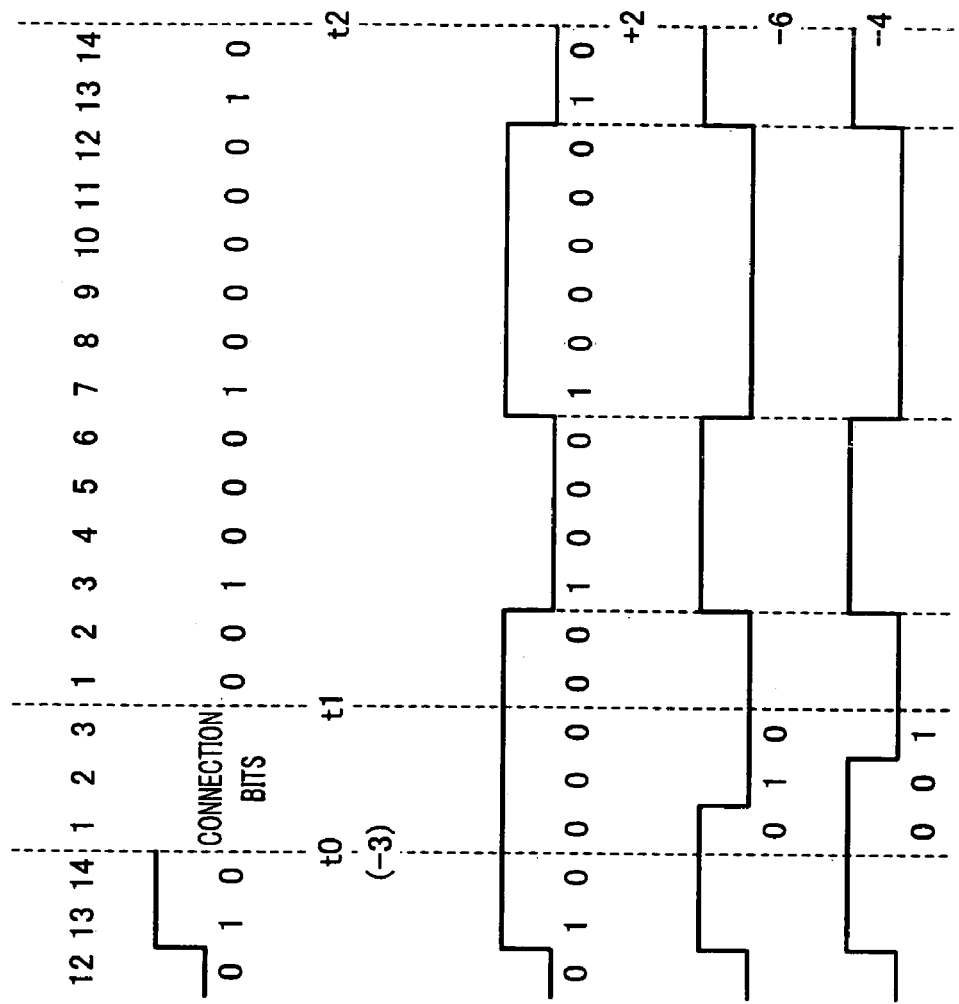
FIG. 14A to FIG. 14D are schematic diagrams describing a method for selecting connection bits.

As shown in FIG. 14A, now the cast that the preceding pattern of 14 bits ends with "010" and the next data symbol is "01110111" (77 h in hexadecimal notation and 119 in decimal notation) will be considered. The data symbol is converted into a pattern of 14 bits "00100010000010". Before timing $t_0$, the preceding pattern of 14 bits ends. At timing $t_1$ after the period of connection bits, the next pattern of 14 bits starts. At timing $t_2$, the next pattern of 14 bits ends.

As to the foregoing four types of connection bits, when "100" is applied, since the condition $T_{min}$=3T is not satisfied, those connection bits cannot be used. However, the other three types of connection bits can be used. As connection bits actually used of the three types of connection bits, one type that decreases the absolute value of DSV is selected. DSV is a cumulative value of which when a waveform is in a high level, "+1" is counted and when a waveform is in a low level, "−1" is counted. As an example, it is assumed that DSV at timing $t_0$ is (−3).

FIG. 14B shows a waveform in the case that "000" is used as connection bits. DSV in period $(t_0-t_1)$ is +3. DSV in period $(t_1-t_2)$ is +2. Thus, DSV at timing $t_2$ is (−3+3+2=+2). FIG. 14C shows a waveform in the case that "010" is used as connection bits. DSV in period $(t_0-t1)$ is −1. DSV in period $(t_1-t_2)$ is −2. Thus, DSV at timing $t_2$ is (−3−1−2=−6). FIG. 14D shows a waveform in the case that "001" is used as connection bits. DSV in period $(t_0-t_1)$ is +1. DSV in period $(t_1-t_2)$ is −2. Thus, DSV at timing $t_2$ is (−3+1−2=−4). After all, connection bits "000" of which DSV at timing $t_2$ is the closest to 0 are selected.

A connection bit selecting portion is disposed in the EFM modulator 12 (see FIG. 4). As described above, the connection bit selecting portion selects connection bits that satisfy $T_{min}$=3 and $T_{max}$=11, which are run-length limit conditions of the EFM modulation. Among these types of connection bits, the connection bit selecting portion selects one type that converges DSV.

According to the present embodiment of the present invention, with a predetermined data pattern that causes DSV to increase and result in a data read error when a conventional EFM modulator is used, the connection bit selecting portion can also select connection bits that do not cause DSV to increase against the predetermined data pattern.

In other words, the connection bit selecting portion detects the case that DSV increases and results in a data read error during reproduction and selects connection bits that lighten the EFM run length limit conditions. For example, $T_{min}$=3 and $T_{max}$=11 are lightened to $T_{min}'$=2 and $T_{max}'$=12, respectively. Alternatively, either $T_{min}$ or $T_{max}$ of the run length limit conditions may be changed. Alternatively, the run length limit conditions may be changed to $T_{min}'$=1 and $T_{max}'$=13.

According to the present invention, special data that has a predetermined data pattern that causes DSV to increase and result in a data read error in the case that a conventional EFM modulator is used is selected as an audio signal from low level data patterns.

An example of special data according to the present invention is "FAFAh", where "h" represents hexadecimal notation. The EFM modulator 12 converts the data "FAFAh" into a code symbol composed of 14 bits. With reference to FIG. 8 to FIG. 13, data "FAh" is converted into a code symbol "10010000010010". Next, connection bits that are placed in the case that such a pattern is repeated twice and data "FAFAh" takes place will be considered.

Figures 15A, 15B:
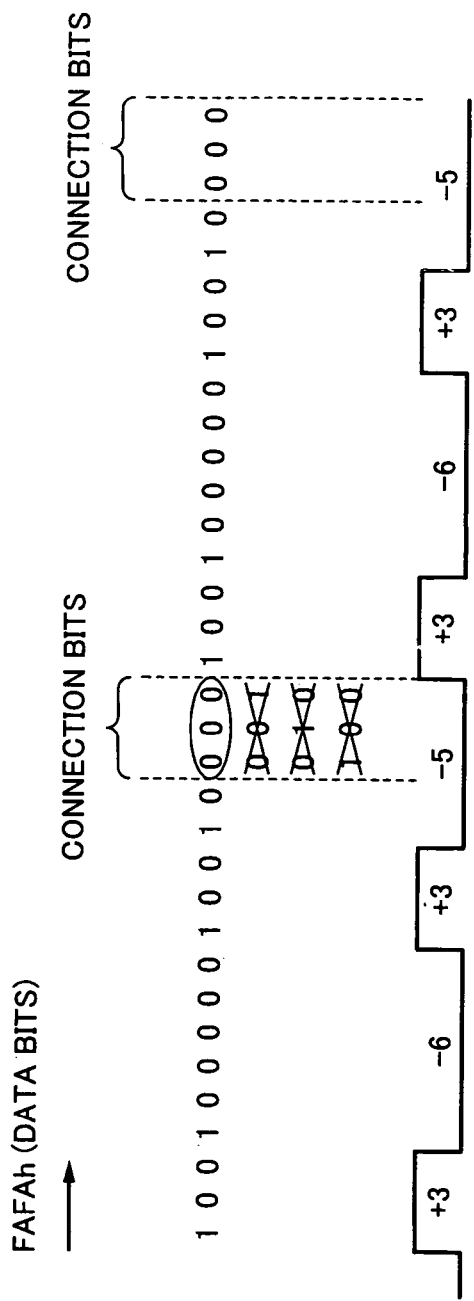
FIG. 15A and FIG. 15B are schematic diagrams showing DSV and a part of a waveform in the case that special data "FAFAh" has been FEM modulated.

FIG. 15A and FIG. 15B are schematic diagrams showing DSV and a part of a waveform in the case that special data "FAFAh" is FEM modulated. As shown in FIG. 15A, connection bits composed of three bits are placed in a code symbol "10010000010010", into which data "FAh" has been converted. At that point, when the foregoing run length limit conditions are $T_{max}$=11 and $T_{min}$=3, only connection bits "000" can be selected. In other words, any of connection bits "001", "010", and "100" cannot satisfy the condition $T_{min}$=3.

Thus, when the data pattern "FAFAh" is used, connection bits are unconditionally fixed to "000". As a result, with the connection bits, DSV cannot be controlled so that it converges. In addition, DSV depends on an original data pattern.

As a result, as shown in FIG. 15B, in each period of data symbols and sets of connection bits, DSV increases by (+3−5+3−6=−5). Thus, DSV diverges. In other words, for one EFM frame, DSV increases by for example 50 or more. As long as the data pattern continues, DSV continuously increases.

After the data pattern completes and for example a random pattern of audio data starts, to approach DSV that continuously increases to "0", connection bits that cause DSV to converge are selected. As a result, DSV sharply decreases.

Thus, in a portion into which a predetermined data pattern according to the present invention is placed, DSV continuously increases. After the portion completes, DSV converges to "0". When data is reproduced from a CD by a reproducing apparatus, the variation of DSV affects an asymmetry compensation and so forth. With a CD on which a pattern corresponding to the foregoing "FAFAh" has been recorded, there is an influence of which original data can be reproduced.

In other words, when a CD master is produced, at a position special data "FAFAh" having a predetermined data pattern is recorded, run length limit conditions are lightened so that connection bits that suppress an increase of DSV are selected when the predetermined data pattern is repeated. With a disc produced in such a manner, a conventional CD reproducing apparatus can normally perform a reproducing operation.

Next, the case that a disc produced in such a manner is tried to be copied with for example a CD-R disc will be considered. A conventional CD-R recording apparatus does not have the EFM modulator 12, the DSV controlling circuit 13, and the area controlling circuit 15, which lighten run length limit conditions in a predetermined record area so as to select connection bits. Thus, such a CD-R disc recording apparatus unconditionally selects connection bits "000" against the predetermined data pattern "FAFAh".

Thus, when a conventional CD reproducing apparatus performs a reproducing operation for a CD-R disc produced in such a manner, DSV continuously increases and results in failure of the reproducing operation. In other words, as a result, from a disc on which the predetermined data pattern according to the present invention has been placed, a copy cannot be produced with a CD-R disc or a CD-RW disc.

Since the high order five bits of the data "FAh" are is and linear PCM data is represented by a 2's complement, as an audio signal, the maximum level does not take place. Thus, even if the special data "FAFAh" is spot-placed in an audio signal, the special data hardly affects a reproduced sound.

As shown in FIG. 4, according to the present embodiment of the present invention, the DSV controlling portion 13 and the area controlling portion 15 are disposed. Special data that composes the foregoing predetermined data pattern is input from the input terminal 8. The DSV controlling circuit 13 sends to the area controlling circuit 15 a command that causes special data to be placed in a predetermined position of main data. The area controlling circuit 15 controls the switching timing of the switching circuit 16 corresponding to the command.

While the switching circuit 16 is placed in the input terminal 8 side, the special data having the pattern "FAFAh" is repeatedly input from the input terminal 8. The CIRC encoder 9 adds an error correction parity to the data of the special pattern that is input from the input terminal 8. The multiplexer 11 multiplexes the data that is output from the CIRC encoder 9 with sub code data. The multiplexed data is supplied to the EFM modulator 12.

Corresponding to the command received from the DSV controlling circuit 13, the EFM modulator 12 selects connection bits that lighten run length limit conditions against a data symbol of which the special data supplied to the EFM modulator 12 has been EFM modulated. Assuming that the run length limit conditions are $T_{min}'=2T$ and $T_{max}'=12T$, there is a possibility for selecting connection bits. As a result, connection bits that cause DSV to converge can be selected. For example, with $T_{min}'=2T$, "010" or "100" can be selected as connection bits.

When the switching circuit 16 has been placed on the input terminal 7 side, to which main data is input, under the control of the area controlling circuit 15 according to the command received from the DSV controlling circuit 13, run length limit conditions of the EFM modulator 12 are $T_{min}=3T$ and $T_{max}=11T$ as usual.

In the foregoing example, it was assumed that the special data having the predetermined data pattern to be placed was "FAFAh". However, the special data is not limited to such an example. For example, with data "FBFBh" and "FAFBh" as special data having a predetermined data pattern, the same effect as data "FAFAh" can be obtained.

Figures 16A, 16B:
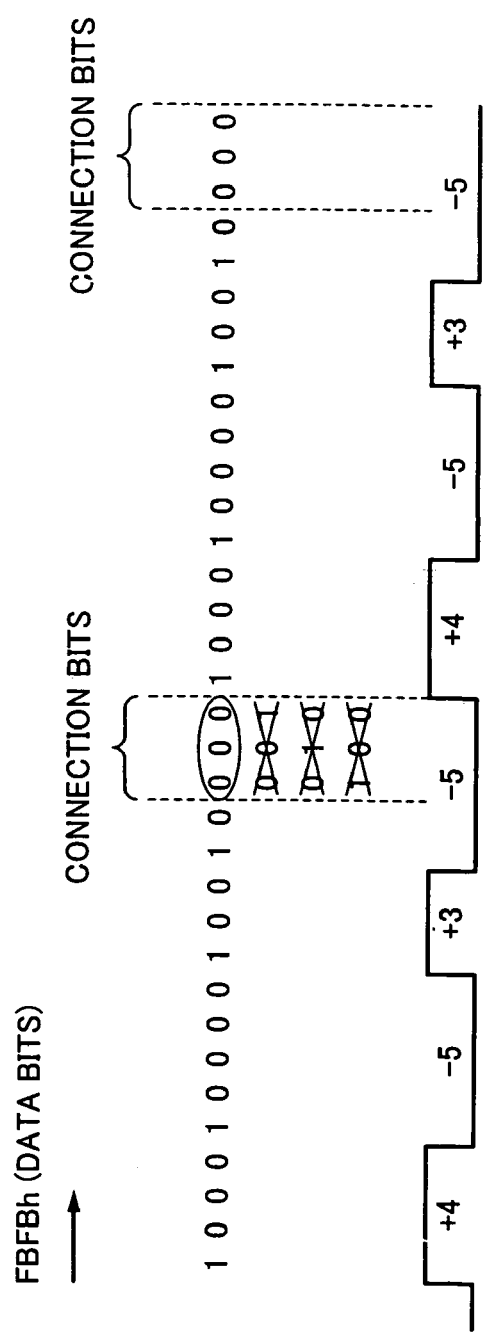
FIG. 16A and FIG. 16B are schematic diagrams showing DSV and a part of a waveform in the case that special data "FBFBh" has been FEM modulated.

Next, with reference to FIG. 16A and FIG. 16B, the case that the data pattern is "FBFBh" will be described. FIGS. 16A and 16B show DSV and a part of a waveform in the case that special data "FBFBh" has been FEM modulated. With reference to FIG. 8 to FIG. 13, data "FBh" is converted into a code symbol "10001000010010" by EFM. Next, connection bits to be placed in the case that the data "FBh" is repeated twice as "FBFBh" will be considered.

As shown in FIG. 16A, connection bits of three bits are placed in the code symbol "10010000010010", into which the data "FBh" has been converted. At that point, when the run length limit conditions are $T_{max}=11$ and $T_{min}=3$, only "000" can be selected as connection bits. In other words, any of connection bits "001", "010", and "100" cannot satisfy a condition $T_{min}=3$.

When the data "FBFBh" is used, connection bits are unconditionally fixed to "000". As a result, with connection bits, DSV cannot be controlled. Thus, DSV depends on an original data pattern. As a result, as shown in FIG. 16B, in each period of data symbols and sets of connection bits, DSV decreases by (+4−5+3−5=−3) and diverges.

When the data "FBh" is used, like the foregoing data "FAh", since the high order five bits are 1s, as an audio signal, the maximum level does not take place. Thus, when the special data "FBFBh" is spot-placed in an audio signal, the special data hardly affects a reproduced sound.

Next, with reference to FIG. 17A and FIG. 17B, the case that data "FAFBh" is used will be described. FIG. 17A and FIG. 17B show DSV and a part of a waveform in the case that the special data "FAFBh" has been FEM modulated. As described above, the data "FAh" and "FBh" can be converted into code symbols "10010000010010" and "10001000010010", respectively, by EFM.

As shown in FIG. 17A, connection bits of three bits are placed between the code symbol "10010000010010", into which the data "FAh" has been converted, and the code symbol "10001000010010", into which the data "FBh" has been converted. At that point, when the run length limit conditions are $T_{max}=11$ and $T_{min}=3$, only "000" can be selected as connection bits. In other words, any of connection bits "001", "010", and "100" cannot satisfy the condition $T_{min}=3$.

Likewise, as connection bits placed between the code symbol "10001000010010", into which the data "FBh" has been converted, and the code symbol "10010000010010", into which the data "FAh" has been converted, only "000" can be selected. Any of connection bits "001", "010", and "100" cannot satisfy the condition $T_{min}=3$.

Thus, when the data pattern "FAFBh" is used, connection bits are unconditionally fixed to "000". As a result, with connection bits, DSV cannot be controlled. Thus, DSV depends on an original data pattern. As a result, as shown in FIG. 17B, when the data "FAh" and the data "FBh" are connected, in each period of data symbols and sets of connection bits, DSV decreases by (+3−6+3−5=−5) and divergences. When the data "FBh" and the data "FAh" are connected, DSV decreases by (+4−5+3−5=−3) and divergences.

Since the high order five bits of each of the data "FAh" and the data "FBh" are is, the maximum level does not take place. Thus, when the special data "FAFBh" is spot-placed in an audio signal, the special data does not affect a reproduced sound.

Figures 18A, 18B:
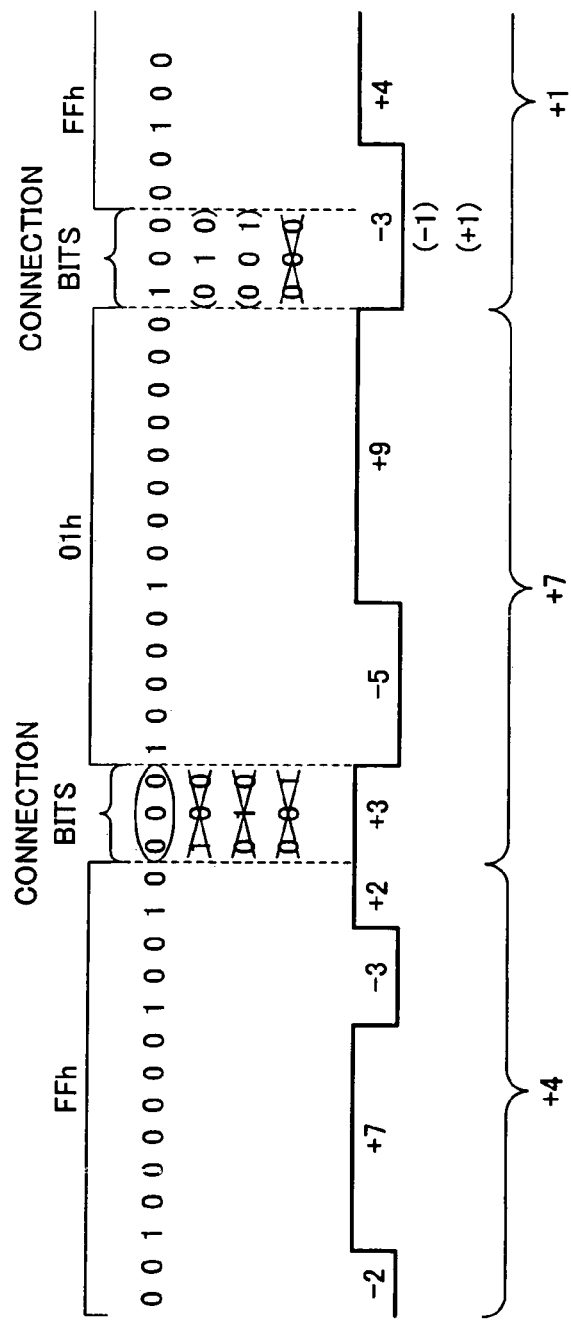
FIG. 18A and FIG. 18B are schematic diagrams showing DSV and a part of a waveform in the case that special data "FF01h" has been FEM modulated.

Special data that has a predetermined data pattern is not limited to the foregoing data "FAh" and data "FBh". Alternatively, for example data "FF01h" can be used. Next, with reference to FIG. 18A and FIG. 18B, the case that the data pattern "FF01h" is used will be described. FIG. 18A and FIG. 18B show DSV and a part of a waveform in the case that the special data "FF01h" has been FEM modulated.

With reference to FIG. 8 to FIG. 13, the data "FFh" and "01h" are converted into code symbols "00100000010010" and "10000100000000", respectively.

As shown in FIG. 18A, when the data "FFh" and "01h" are connected, if the run length limit conditions are $T_{max}=11$ and $T_{min}=3$, due to the restriction of $T_{min}$, as connection bits placed between the code symbol "00100000010010", into which the data "FFh" has been converted, and the code symbol "10000100000000", into which the data "01h" has been converted, connection bits "000" are unconditionally selected. At that point, from the beginning of the connection bits until the end of the code symbol "10000100000000", into which the data "01h" has been converted, DSV becomes "+7" as shown in FIG. 18B.

When the data "00h" and "FFh" are connected, if the run length limit conditions are $T_{max}=11$ and $T_{min}=3$ due to the restriction of $T_{max}$, as connection bits that are placed between code symbols into which the data "00h" and "FFh" have been converted, other than "000" can be selected. At that point, as is clear from FIG. 18A and FIG. 18B, after the beginning of the selected connection bits until the end of the code symbol "00100000010010", into which the data "FFh" has been converted, when "100", "010", and "001" are selected as connection bits, DSV="+1", DSV="+3", and DSV="+5", respectively. Thus, to cause DSV to become minimum, "100" is selected as connection bits.

Thus, when a pattern of the data "FF01h" is repeated, as connection bits, "000" and "100" are selected so that DSV becomes minimum. As a result, DSV continuously increase by "+8" (=+1+7) and diverges.

The number of quantizers of PCM data used for a CD is 16 bits, which is composed of two bytes. As was described above, in a CD, PCM data is represented by a 2's complement. The high order nibble is "0h" or "Fh", which represents low level data as an audio signal. The data pattern "FF01h" is two-byte data, whose high order byte is "FFh". 2's complement of the data pattern "FF01h" does not become the maximum level. Thus, when the data pattern "FF01h" is spot-placed in an audio signal, the data pattern "FF01h" does not affect a reproduced sound.

Figures 19A, 19B:
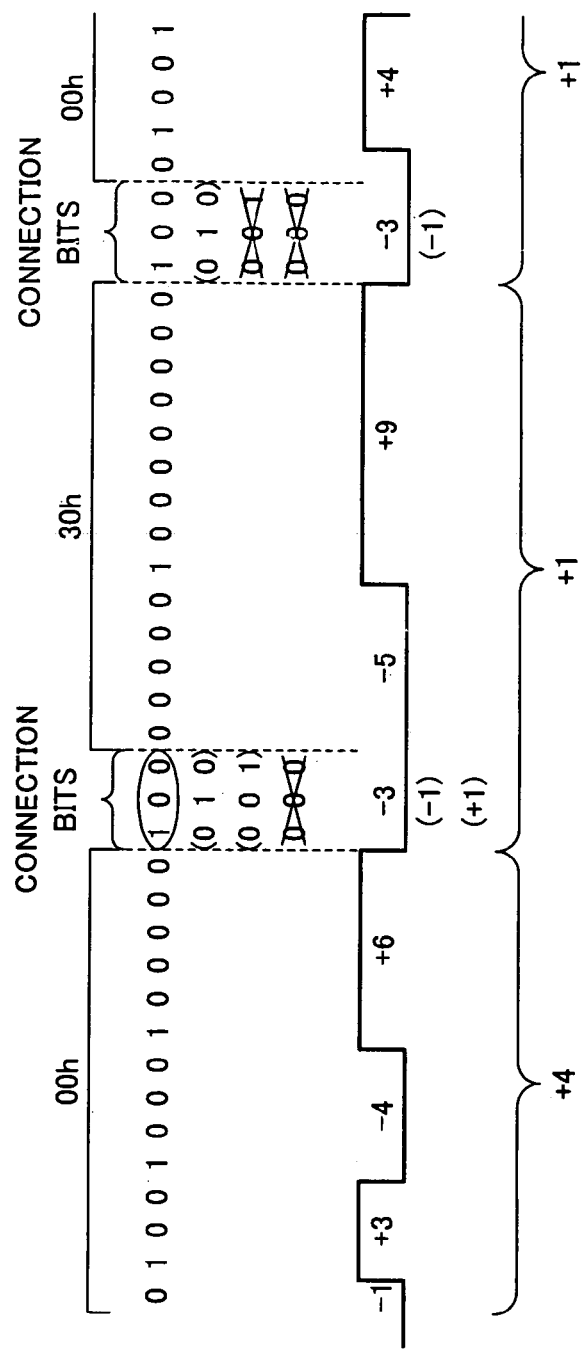
FIG. 19A and FIG. 19B are schematic diagrams showing DSV digital sum value and a part of a waveform in the case that special data "0030h" has been FEM modulated.

The data pattern of the data "FAh" and "FBh" and the data pattern "FF01h" are data having negative values as audio signals (PCM data). Alternatively, the present invention can be applied to data that has a positive value as an audio signal. Next, with reference to FIG. 19A and FIG. 19B, the case that a data pattern "0030h" is used will be described. FIG. 19A and FIG. 19B show DSV and a part of a waveform in the case that special data "0030h" has been FEM modulated.

With reference to FIG. 8 to FIG. 13, the data "00h" and "30h" are converted into code symbols "01001000100000" and "00010000010000", respectively by EFM. As shown in FIG. 19A, connection bits of three bits are placed between the code symbol "10010000010010", into which the data "00h" has been converted, and the code symbol "00010000010000", into which the data "30h" has been converted.

At that point, when the run length limit conditions are $T_{max}=11$ and $T_{min}=3$, due to the restriction of $T_{max}$, "000" cannot be selected as connection bits. As is clear from FIG. 19A and FIG. 19B, after the beginning of the selected connection bits until the end of the code symbol "00010000010000", into which the data "30h" has been converted, when "100", "010", and "001" are selected as connection bits, DSV="+1", DSV="+3", and DSV="+5", respectively. Thus, to cause DSV to become minimum, "100" is selected as connection bits.

In the data pattern "0030h", the data "30h" is followed by the data "00h". When the run length limit conditions are $T_{max}=11$ and $T_{min}=3$, connection bits placed between the code symbol "00010000010000", into which the data "30h" has been converted, and the code symbol "10010000010010", into which the data "00h" has been converted are either "100" or "010". After the beginning of the selected connection bits until the end of the code symbol "01001000100000", into which the data "00h" has been converted, when "100" and "010" are selected as connection bits, DSV="+1" and DSV="+3", respectively. Thus, to cause DSV to become minimum, "100" is selected as connection bits.

Thus, when a pattern of the data "0030h" is repeated, to cause DSV to become minimum, "100" is always selected as connection bits. As a result, DSV continuously increases by "+2" (=+1+1) and divergences.

The number of quantizers of PCM data used for a CD is 16 bits, which is composed of two bytes. The data "0030h" is two-byte data, whose high order byte is "00h", which is not the maximum level. Thus, when the data "0030h" is spot-placed in an audio signal, the data does not affect a reproduced sound.

An example of which an audio signal is a positive value and DSV divergences is not limited to a pattern of the foregoing data "0030h". For example, when a pattern of data is "009Eh", DSV increases by "+4" and divergences. In this case, when the data "00h" and the data "9Eh" are connected, connection bits "100" are selected. When the data "9Eh" and the data "00h" are connected, connection bits "000" are selected.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention. For example, as a modulating system other than EFM, the present invention can be applied to the 8-16 modulating system so-called EFM Plus. The EFM Plus is a system that converts an eight-bit data symbol into a 16-bit code symbol without need to use connection bits. In the EFM Plus, there are predetermined data patterns with which the absolute value of DSV increases. Thus, when an encoder that has a code conversion table that is modified from the standard code conversion table is used, even if a predetermined data pattern is used, DSV can be prevented from increasing. Thus, it can be determined whether or not a disc to be used is an original disc of which data was recorded using an encoder according to the present invention or a copied disc of which data was recorded using a conventional encoder.

The present invention can be also applied to a multi-session optical disc on which for example CD-DA formatted data and CD-ROM formatted data are recorded. As information that can be recorded to an optical disc, there are various types of data such as audio data, video data, still picture data, character data, computer graphic data, game software, and computer programs. When information that is recorded on an optical disc is video data and still picture data, data that is displayed in a color closer to gray in a reproduced video and/or picture can be used as special data. Thus, the present invention can be applied to for example a DVD (Digital Versatile Disc) video and a DVD-ROM. In addition, the present invention can be applied to not only a disc-shaped data recording medium, but a card-shaped data recording medium.

As was described above, according to the present invention, a data sequence in a predetermined area on a recording medium is very low level data of a digital audio signal. A predetermined pattern is recorded in the predetermined area of the recording medium in such a manner that when a conventional encoder encodes the predetermined pattern, it causes DSV to deviate from a predetermined range and that when a special encoder encodes the predetermined pattern, it causes DSV to reside in the predetermined range. Thus, when the predetermined pattern data has been encoded by the special encoder and recorded in the predetermined area of the recording medium, if the predetermined pattern data is reproduced by a conventional reproducing apparatus, DSV deviates from the predetermined range. As a result, the reproducing operation cannot be properly performed. As a result, the recording medium can be copy-protected.

In addition, as the predetermined pattern data that causes DSV to deviate from the predetermined range when the predetermined pattern is encoded by the conventional encoder, very low level data of a digital audio signal is used. Thus, the recording medium can be copy-protected with sufficient suppression of the influence of the predetermined pattern data against the reproduced sound.

The invention claimed is:

1. A recording method for converting m-bit data into an n-bit (where n>m) data symbol whose run length is restricted and adding a plurality of connection bits after the n-bit data symbol so that a cumulative digital sum value (DSV) per unit time of the data symbol becomes small, the recording method comprising the steps of:
   determining whether at least a preceding data symbol is a special data symbol and, when at least the preceding data symbol is the special data symbol, lightening the restriction of the run length and selecting the connection bits;
   adding the selected connection bits to the preceding data symbol so as to generate record data; and
   recording the generated record data on a recording medium.

2. The recording method as set forth in claim 1, further comprising:
   determining the cumulative DSV;
   determining whether the cumulative DSV would result in an error when the record data is read from the recording medium; and
   lightening the restriction of the run length when the cumulative DSV would result in the error.

3. The recording method as set forth in claim 2, wherein the m-bit data is modulated according to an 8-14 modulating system.

4. The recording method as set forth in claim 1, wherein the special data symbol is based on low level data as an audio signal.

5. The recording method as set forth in claim 4, wherein the low level data is recorded in a unit of one byte, the high order nibble of each byte being "0h" or "Fh" in 2's complement notation.

6. The recording method as set forth in claim 5, wherein the low level data contains a data pattern composed of "FAh".

7. The recording method as set forth in claim 5, wherein the low level data contains a data pattern composed of "FBh".

8. The recording method as set forth in claim 5, wherein the low level data contains a data pattern composed of "FAFBh".

9. The recording method as set forth in claim 5, wherein the low level data contains a data pattern composed of "FF01h".

10. The recording method as set forth in claim 5, wherein the low level data contains a data pattern composed of "0030h".

11. The recording method as set forth in claim 5, wherein the low level data contains a data pattern composed of "009Eh".

12. The recording method as set forth in claim 1, wherein the special data symbol is repeatedly recorded.

13. The recording method as set forth in claim 12, further comprising after the special data symbol is repeatedly recorded, selecting the connection bits so that the cumulated DSV approaches zero.

14. The recording method as set forth in claim 12, wherein the recording step is performed by recording the record data containing the special data symbol to a predetermined area of the recording medium.

15. A recording method for converting m-bit data into n-bit (where n>m) bit data whose run length is restricted and recording the converted data on a recording medium, the recording method comprising the steps of:
   determining whether at least a preceding n-bit data contains a special data pattern and, when at least the preceding n-bit data contains the special data pattern, lightening the restriction of the run length; and
   recording data so that a cumulative digital sum value (DSV) per unit time of the bit data increases when the data is reproduced in a state that the run length is restricted.

16. The recording method as set forth in claim 15, wherein the n-bit data is composed of an n1-bit data symbol and n2-bit (where n2=n−n1) connection bits that cause the cumulative DSV per unit time to become small,
   wherein the recording method further comprises the steps of:

determining whether the preceding n-bit data contains a special data symbol and, when the preceding n-bit data contains the special data symbol, lightening the restriction of the run length;

selecting the connection bits; and adding the selected connection bits to the preceding n-bit data symbol.

17. The recording method as set forth in claim 16, further comprising the step of:

determining the cumulative DSV;

determining whether the cumulative DSV would result in an error when data is read from the recording medium; and lightening the restriction of the run length when the cumulative DSV would result in the error.

18. The recording method as set forth in claim 17, wherein the m-bit data is modulated according to an 8-14 modulating system.

19. The recording method as set forth in claim 15, wherein the selecting step is performed by selecting a following n-bit data so that the cumulative DSV per unit time becomes small based on the preceding n-bit data and the following n-bit data.

20. The recording method as set forth in claim 19, wherein the m-bit data is modulated according to an 8-16 modulating system.

21. The recording method as set forth in claim 15, wherein the special data symbol is based on low level data as an audio signal.

22. The recording method as set forth in claim 21, wherein the low level data is recorded in a unit of one byte, the high order nibble of each byte being "0h" or "Fh" in 2's complement notation.

23. The recording method as set forth in claim 22, wherein the low level data contains a data pattern composed of "FAh".

24. The recording method as set forth in claim 22, wherein the low level data contains a data pattern composed of "FBh".

25. The recording method as set forth in claim 22, wherein the low level data contains a data pattern composed of "FAFBh".

26. The recording method as set forth in claim 22, wherein the low level data contains a data pattern composed of "FF01h".

27. The recording method as set forth in claim 22, wherein the low level data contains a data pattern composed of "0030h".

28. The recording method as set forth in claim 22, wherein the low level data contains a data pattern composed of "009Eh".

29. The recording method as set forth in claim 16, wherein the special data symbol is repeatedly recorded.

30. The recording method as set forth in claim 29, further comprising after the special data symbol is repeatedly recorded, selecting the connection bits so that the cumulated DSV approaches zero.

31. The recording method as set forth in claim 29, wherein the recording step is performed by recording the data containing the special data symbol to a predetermined area of the recording medium.

32. A recording apparatus, comprising:

an encode process portion configured to perform an encode process for input data;

a converting portion configured to convert m-bit data, that is output from the encode process portion, into n-bit (where n>m) data whose run length is restricted;

a determining portion configured to determine whether a preceding n-bit data contains a special data pattern and, when the preceding n-bit data contains the special data pattern, to lighten the restriction of the run length, wherein a cumulative digital sum value (DSV) per unit time of the bit data increases when the data is reproduced in a state that the run length is restricted; and a recording portion configured to record data that is output from the converting portion on a recording medium.

33. The recording apparatus as set forth in claim 32, wherein the converting portion is configured to select a following n-bit data so that the cumulative DSV per unit time becomes small based on the preceding n-bit data and the following n-bit data.

34. The recording apparatus as set forth in claim 33, wherein the converting portion is configured to convert the m-bit data according to an 8-16 modulating system.

35. The recording apparatus as set forth in claim 32, wherein the n-bit data is composed of an n1-bit data symbol and n2-bit (where n2=n−n1) connection bits that cause the cumulative DSV per unit time to become small, and wherein the converting portion is configured to lighten the restriction of the run length, select the connection bits, and add the selected connection bits to the preceding data symbol when the preceding data contains a special data symbol.

36. The recording apparatus as set forth in claim 35, wherein the converting portion includes:

a determining unit for determining the cumulative DSV; and a connection bit selecting portion configured to determine whether the cumulative DSV would result in an error when data is read from the recording medium, to lighten the restriction of the run length, and to select the connection bits from a plurality of connection bits.

37. The recording apparatus as set forth in claim 35, wherein the converting portion is configured to convert the m-bit data according to an 8-14 modulating system.

38. The recording apparatus as set forth in claim 35, wherein the recording portion is configured to repeatedly record the special data symbol.

39. The recording apparatus as set forth in claim 38, wherein after the special data symbol is repeatedly recorded, the converting portion is configured to select the connection bits so that the cumulated DSV approaches zero.

40. The recording apparatus as set forth in claim 38, wherein the data containing the special data symbol is recorded to a predetermined area of the recording medium.

41. The recording apparatus as set forth in claim 35, wherein the special data symbol is based on low level data as an audio signal.

42. The recording apparatus as set forth in claim 41, wherein the low level data is recorded in a unit of one byte, the high order nibble of each byte being "0h" or "Fh" in 2's complement notation.

* * * * *

UNITED STATES PATENT AND TRADEMARK OFFICE
CERTIFICATE OF CORRECTION

PATENT NO. : 7,304,932 B2  
APPLICATION NO. : 10/483261  
DATED : December 4, 2007  
INVENTOR(S) : Yoichiro Sako et al.

It is certified that error appears in the above-identified patent and that said Letters Patent is hereby corrected as shown below:

Column 9, line 47, change "is" to --1s--.

Column 11, line 18, change "is" to --1s--.

Signed and Sealed this

Fifteenth Day of July, 2008

JON W. DUDAS  
*Director of the United States Patent and Trademark Office*